(12) United States Patent
Olofsson

(10) Patent No.: US 6,465,883 B2
(45) Date of Patent: *Oct. 15, 2002

(54) CAPSULE FOR AT LEAST ONE HIGH POWER TRANSISTOR CHIP FOR HIGH FREQUENCIES

(75) Inventor: Lars-Anders Olofsson, Järfälla (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/348,304

(22) Filed: Jul. 7, 1999

(65) Prior Publication Data

US 2002/0014694 A1 Feb. 7, 2002

(30) Foreign Application Priority Data

Jul. 8, 1998 (SE) ................................. 9802453

(51) Int. Cl.[7] .............................. H05K 7/02; H05K 7/20; H01L 23/02; H01L 39/02; H01L 23/12
(52) U.S. Cl. ................. 257/728; 257/774; 257/724; 257/725; 257/730; 257/731; 257/732; 257/733; 257/704; 257/712; 257/713; 257/710; 257/711; 257/707; 257/675
(58) Field of Search ................. 257/678, 712, 257/713, 717, 720, 704, 700, 774, 675, 796, 703, 705, 707, 709, 710, 711, 728, 724, 725, 684, 730–733

(56) References Cited

U.S. PATENT DOCUMENTS

| | | | |
|---|---|---|---|
| 3,946,428 A | | 3/1976 | Anazawa et al. |
| 4,107,727 A | * | 8/1978 | Ikezawa et al. |
| 4,376,287 A | * | 3/1983 | Sechi .......................... 29/571 |
| 4,819,041 A | * | 4/1989 | Redmond |
| 4,839,712 A | | 6/1989 | Mamodaly et al. |
| 4,943,470 A | * | 7/1990 | Shiromizu et al. ........... 428/209 |
| 5,012,386 A | * | 4/1991 | McShane et al. ............ 361/386 |
| 5,166,097 A | * | 11/1992 | Tanielian |
| 5,285,352 A | * | 2/1994 | Pastore et al. ............... 361/707 |
| 5,381,042 A | * | 1/1995 | Lerner et al. ................ 257/712 |
| 5,397,912 A | * | 3/1995 | Ommen et al. .............. 257/700 |
| 5,422,615 A | * | 6/1995 | Shibagaki et al. ........... 333/246 |
| 5,438,305 A | * | 8/1995 | Hikita et al. .................... 333/32 |
| 5,481,136 A | | 1/1996 | Kohmoto et al. |
| 5,488,254 A | * | 1/1996 | Nishimura et al. .......... 257/707 |
| 5,598,034 A | * | 1/1997 | Wakefield ..................... 257/706 |
| 5,642,261 A | * | 6/1997 | Bond et al. .................. 257/707 |
| 5,644,163 A | * | 7/1997 | Tsuji ........................... 257/706 |
| 5,650,915 A | * | 7/1997 | Alfaro et al. ................ 257/710 |
| 5,703,395 A | * | 12/1997 | Berney ........................ 257/681 |
| 5,719,442 A | * | 2/1998 | Otsuki ......................... 257/712 |
| 5,856,911 A | * | 1/1999 | Riley .......................... 257/713 |
| 5,920,458 A | * | 7/1999 | Azar ........................... 257/706 |
| 5,942,797 A | * | 8/1999 | Terasawa ..................... 257/712 |
| 5,959,846 A | * | 9/1999 | Noguchi et al. ............. 257/704 |
| 5,969,414 A | * | 10/1999 | Parthasarathi et al. ...... 257/675 |
| 6,011,691 A | | 1/2000 | Schreffler .................... 257/738 |
| 6,091,137 A | * | 7/2000 | Fukuda ........................ 257/774 |
| 6,097,089 A | * | 8/2000 | Gaku et al. .................. 257/712 |
| 6,113,399 A | * | 9/2000 | Hundt et al. ................... 459/70 |
| 6,137,170 A | * | 12/2000 | Ujiie et al. .................. 257/711 |

* cited by examiner

Primary Examiner—Alexander O. Williams
(74) Attorney, Agent, or Firm—Burns, Doane, Swecker & Mathis, L.L.P.

(57) ABSTRACT

The present invention relates to a capsule (1) for at least one high power transistor chip (17) for high frequencies, comprising an electrically and thermally conductive flange (10), at least two electrically insulating substrates (15), and at least two electrical connections (16), and a cover member, where the high power transistor chip (17) is arranged on the flange (10). The high power transistor chip (17) and the electrically insulating substrates (15) are arranged on the flange (10). The electrical connections (16) are arranged on electrically insulating substrates (15) and the electrically insulating substrates (15) are connected to the flange (10) and open and separate from the high power transistor chip (17).

14 Claims, 4 Drawing Sheets

Prior Art

CAPSULE FOR AT LEAST ONE HIGH POWER TRANSISTOR CHIP FOR HIGH FREQUENCIES

This application claims priority under 35 U.S.C. §§119 and/or 365 to 9802453-2 filed in Sweden on Jul. 8, 1998; the entire content of which is hereby incorporated by reference.

The present invention relates to a capsule for semiconductor components and more particularly to a capsule for high frequency power transistors, such as LDMOS-transistors, with which maximum thermal conduction is required and which can be surface soldered.

BACKGROUND OF THE INVENTION

High frequency power transistors for use with, e.g. power stages for base radio transmitters for mobile telephones or with high frequency radio transmitters, such as ground transmitters for digital radio and analogue TV are mainly of two types, namely bipolar and LDMOS types. A bipolar-type transistor has to be mounted on an electric insulator, whereas LDMOS-type transistors can be mounted on an underlying electrically conductive surface.

Encapsulation of LDMOS-transistors is typically effected with the aid of a ceramic electrical insulator in the form of a frame which encloses the transistor. The LDMOS-transistor is mounted on an electrically conductive so-called flange. Connected to the electrically insulating frame are connections which are used as conductors between at least one circuit board and the transistor. The ceramic insulator may be constructed from alumina, since the thermal flow will not pass through the ceramic material.

One of the problems with known techniques is that the flange must comprise CuW (a composite of copper and tungsten) in order to achieve an effective match between a linear expansion of the ceramic and linear expansion of the flange. The CuW-flange is relatively expensive and has only half the electrical conductivity of copper. Another problem is that the electrically insulating frame becomes weak and is liable to crack in the manufacture of the capsule, due to the differences in the thermal expansion between the frame and the flange, which results in a low yield and in a very expensive capsule. Furthermore, it is not possible to surface solder present day power transistor capsules.

SUMMARY OF THE INVENTION

One problem with known capsules for high frequency transistors is that they include a narrow electrically insulating ceramic frame which can crack easily in the manufacture of the capsule.

Another problem is that a so-called flange requires a special material, such as CuW, in order to obtain the best possible match between the linear expansion of the flange and the linear expansion of the ceramic frame.

Yet another problem is that CuW does not have satisfactory electrical conductivity.

The present invention addresses these problems through the medium of a capsule for at least one high frequency, high power transistor chip that includes an electrically conductive and thermally conductive flange, at least two electrically insulating substrates, at least two electrical connections, and a cover member, wherein the high power transistor chip and the electrically insulating substrates are arranged on the flange, and wherein the electrical connections are arranged on the electrically insulating substrate. The electrically insulating substrates are arranged to partially enclose the chip.

The flange may conveniently be made of copper. In a preferred embodiment, when the inventive shall be surface soldered the electrically insulating substrates are arranged on at least two side edges of the flange. The substrate is metallized from an upper side thereof, around one edge and down to an underside thereof.

The difference in linear expansion between the flange material and the substrate material may be large without danger of the substrates cracking, due to the fact that the substrates can be given a small size.

The object of the present invention is to provide a capsule that has better thermal conductivity and that is cheaper than its prior art counterpart, and which can also be surface soldered.

One advantage afforded by the invention is that copper can be used in the flange.

Another advantage is that there is no danger of the electrically insulating substrates splitting after having been hard soldered to the flange.

The invention will now be described in more detail with reference to exemplifying embodiments thereof and also with reference to the accompanying drawings.

DETAILED DESCRIPTION OF PREFERRED EMBODIMENTS.

Figure 1:
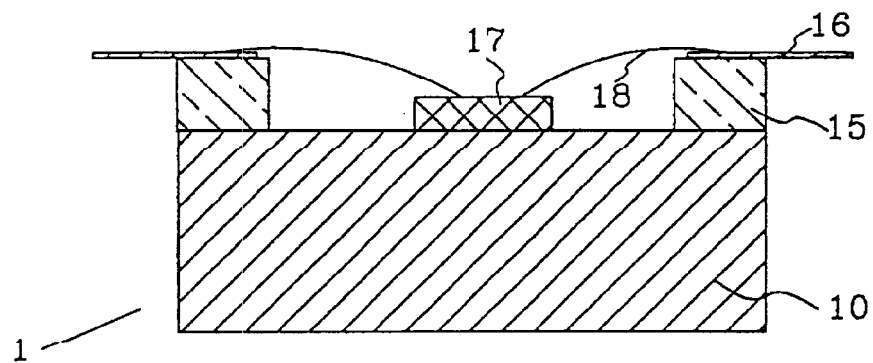
FIG. 1 is a side-on sectioned view of a known capsule having a cover member 5.

FIG. 1 is a side-on sectioned view of a known capsule, minus its cover member. The capsule 1 includes a flange 10, an electrically insulating substrate 15, two electrical connections 16, and a high frequency transistor chip 17 with associated connection conductors 18. The flange 10 is produced from an electrically conductive material whose coefficient of linear expansion is adapted to the material in the electrically insulating substrate 15. Although not shown, the capsule also includes a cover member.

Figure 2:
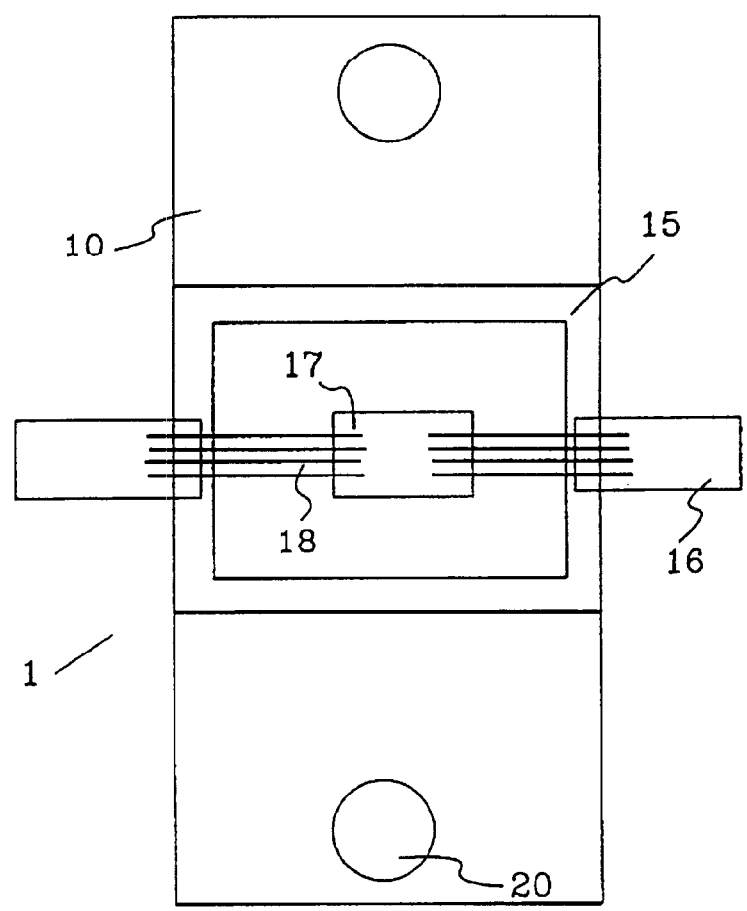
FIG. 2 shows the capsule of FIG. 1 from above, minus its cover member.

FIG. 2 shows the known capsule of FIG. 1 from above. It will be evident from this perspective view that the electrically insulating substrate 15 is arranged around the high frequency transistor chip 17 in a frame-like configuration. It will also be seen that the flange includes a pair of holes 20. These holes are used to connect the flange 10 to a cooler by means of a pair of screws or rivets.

Figure 3:
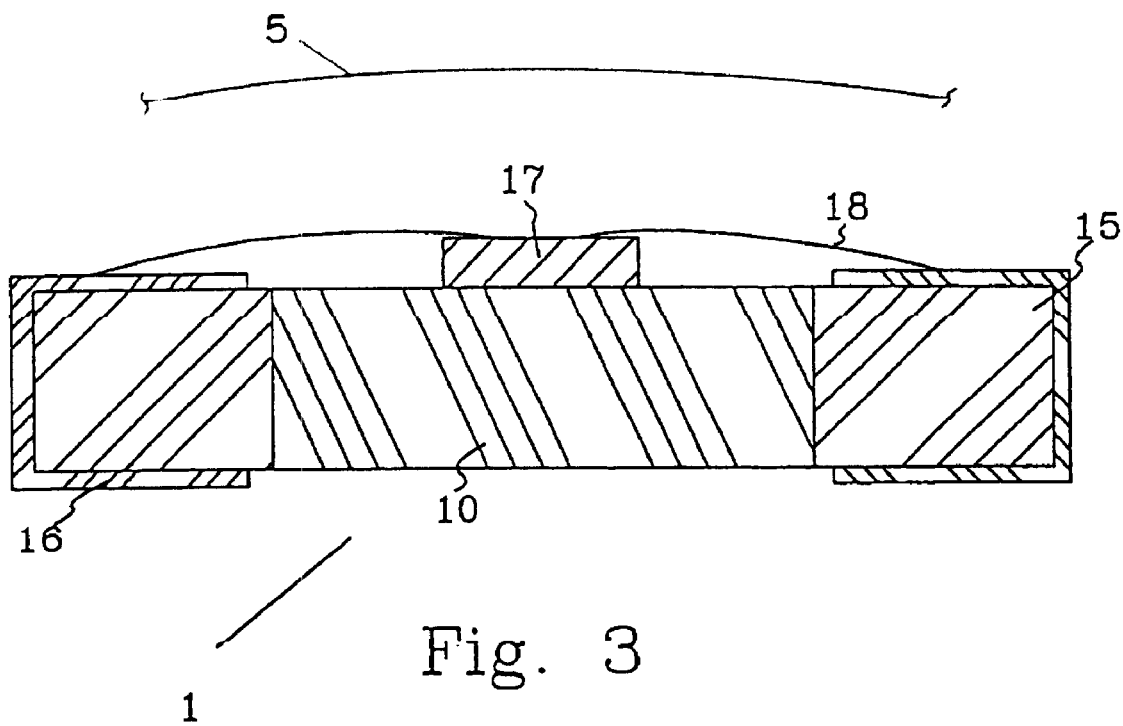
FIG. 3 is a side-on sectioned view of another embodiment of the capsule, minus its cover member.

FIG. 3 is a side-on sectioned view of an inventive capsule minus its cover member. In this embodiment, the electrically insulating substrates 15 are accommodated in two recesses on the side edges of the flange 10. As apparent from FIG. 3, the substrates 15 may have the same height as the flange 10 to which they are connected. The electrically insulating substrates of the FIG. 3 embodiment are provided with electrical connections 16 in the form of a metallization from one upper side, around the side edge and on an underside, so as to obtain an electrical connection of low inductance between the upper side and the under side of the capsule.

Figure 4:
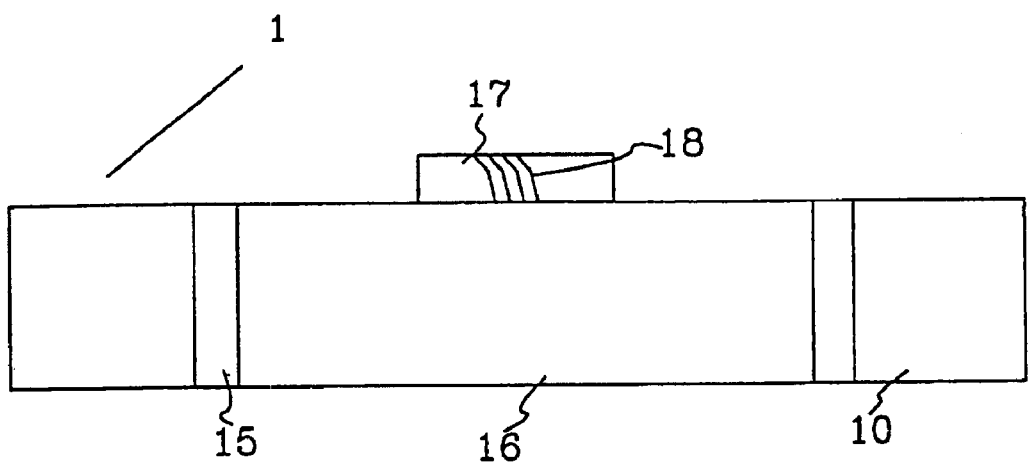
FIG. 4 is a side-on view of another embodiment of the inventive capsule, minus its cover member.
Figure 5:
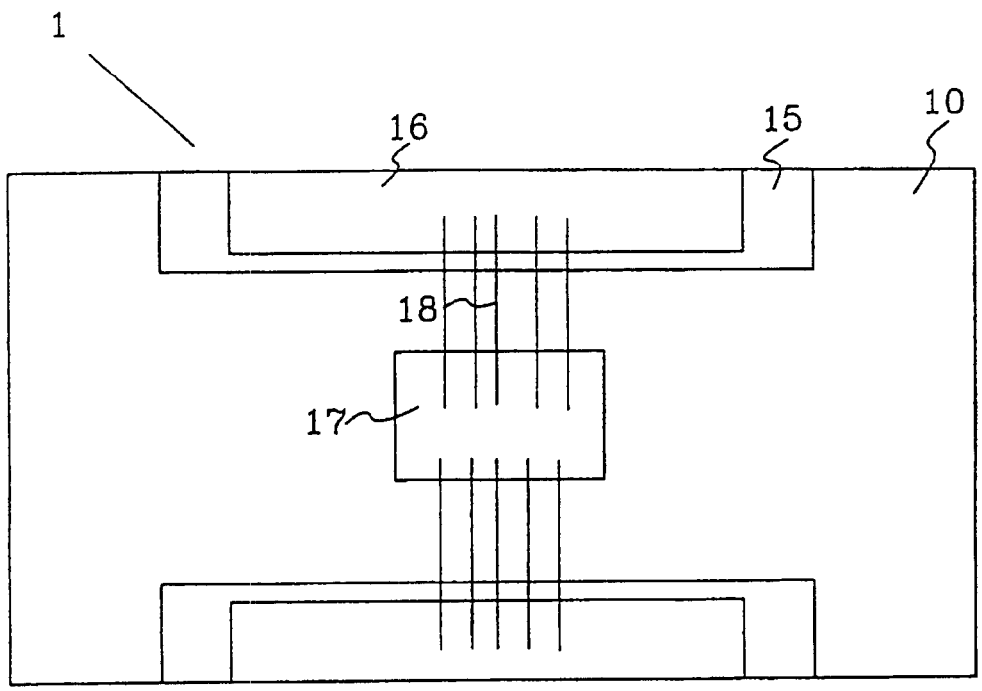
FIG. 5 illustrates the capsule of FIG. ? or FIG. ? seen from above, minus its cover member.

FIG. 4 is a side view of the embodiment shown in FIG. 3. FIG. 5 shows the embodiment of FIG. 3 and FIG. 4 from above. It will be evident from FIGS. 4 and 5 that a gap has been left between the metallization and the flange 10, so as to avoid contact therebetween. The electrically insulating substrates can be metallized, by printing in a manner which is well known to those skilled in this art and which will not therefore be described in detail.

Figure 6:
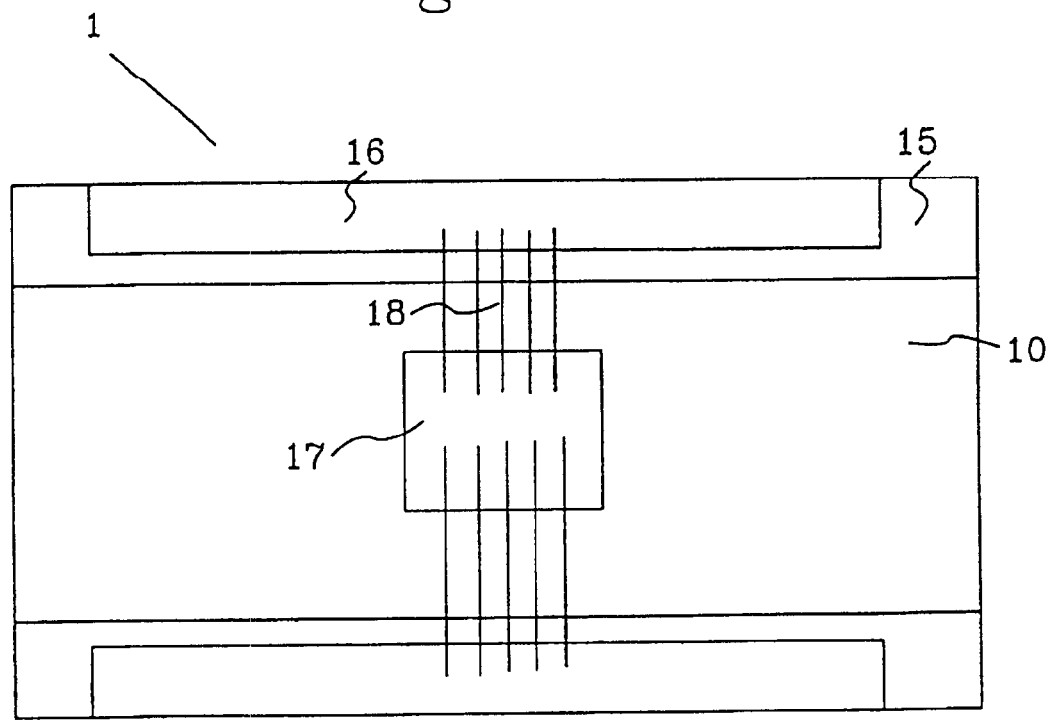
FIG. 6 illustrates the capsule of FIG. ? or FIG. ? from above, minus its cover member.

FIG. 6 shows another embodiment of an inventive capsule from above, minus its cover member. In this embodiment, the electrically insulating substrates have been arranged along the full extension of the side edges of the flange instead of in said recesses. As evident from FIG. 5, the metallization that forms the electrical connections on the substrates may be somewhat incomplete, in other words the surfaces need not be fully covered. However, the metallization may not come into contact with the flange 10.

Figure 7:
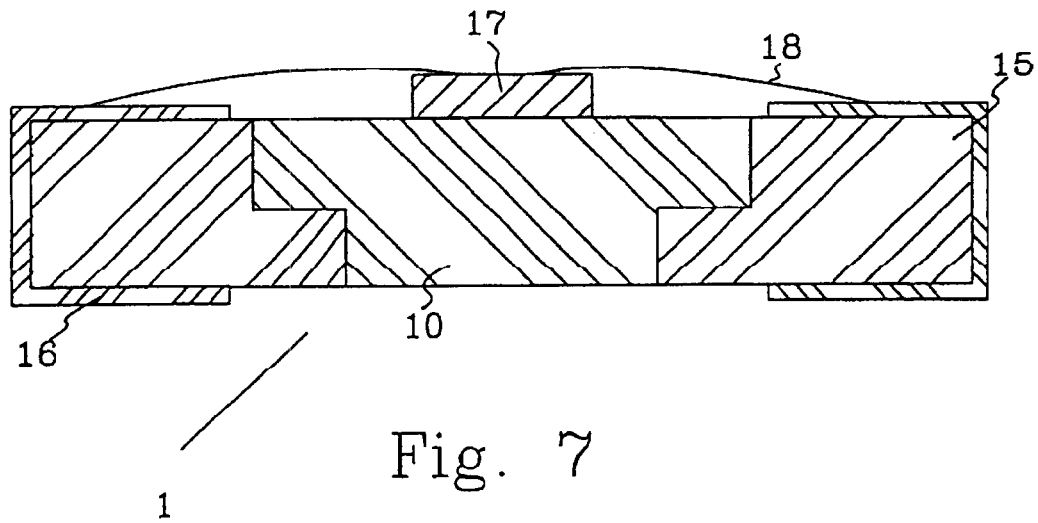
FIG. 7 is a sectioned side-on view of another embodiment of the inventive capsule minus its cover member.

FIG. 7 is a side-on sectioned view of another embodiment of an inventive capsule minus its cover member. In this embodiment, the electrically insulating substrate 15 and the edge of the flange to which the substrate shall be connected is modified with the intention of simplifying manufacture. In the FIG. 7 embodiment, the connecting surfaces of the flange 10 and the substrate 15 have been adapted to one another in step-like configuration. This simplifies joining of the flange to the substrate and allows the underside to be flat.

Figure 8:
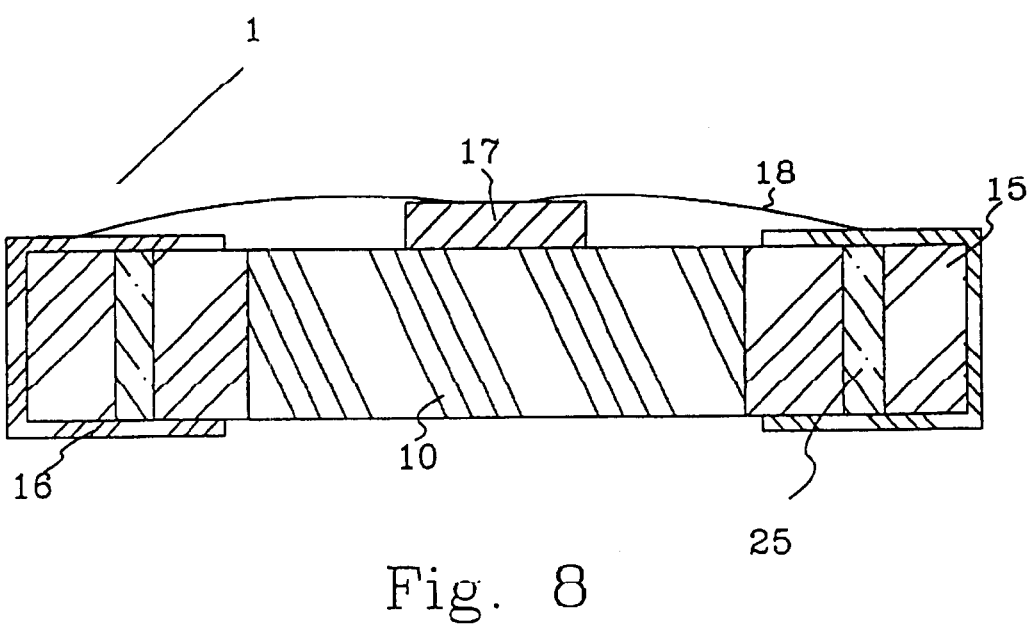
FIG. 8 is a sectioned side-on view of still another embodiment of the inventive capsule, minus its cover member.

A possibility of improving the performance of the capsule lies in placing so-called vias 25 through the electrically insulating substrate 15 in accordance with FIG. 8. Such vias will reduce a series inductance in the electrical connections.

The flange may include a number of screw holes 20 or apertures for mounting a circuit board or a cooler. However, the flange may alternatively be soldered to a circuit board, therewith obviating the need for screw holes.

Each electrically insulating substrate may include one or more electrical connections 16.

Copper, copper-diamond -composite, copper-molybdenum-copper—composite, copper-tungsten-copper -composite are examples of materials that have good thermal conductivity and are conceivably suitable as flange material.

It will be understood that the invention is not limited to the described and exemplifying embodiments thereof and that modifications can be made within the scope of the following claims.

What is claimed is:

1. A capsule for at least one high power transistor chip for high frequencies, comprising:
    an electrically and thermally conductive flange with an upper side, an underside, and side edges;
    at least two electrical insulators each having an upper side, an underside and a side edge and a geometric shape, the side edge of the electrical insulators is connected to the flange and corresponds with the shape and size of the respective side edge of the flange, so as to enable the upper sides and the under sides of the flange and of the electrical insulator, respectively, to be brought readily into mutually the same plane;
    at least two first electrical connections;
    a cover member; and
    wherein the high power transistor chip is arranged on the flange, such that the upper side of the flange extends laterally beyond the high power transistor chip; the electrical insulators are separated from the high power transistor chip and in that second electrical connections are connected to the high power transistor chip and the first electrical connections, wherein the at least two first electrical connections are formed by metallizing the electrical insulators from the upper side, around the side edge and down to the underside.

2. A capsule according to claim 1, wherein the flange is made of copper.

3. A capsule according to claim 1, wherein the flange is made of either a copper-molybdenum-copper-composite or a copper-tungsten-copper-composite or a copper-diamond-composite.

4. A capsule according to claim 2, wherein the electrical insulators are disposed along a recess on at least one of the side edges of said flange.

5. A capsule according to claim 2, wherein the electrical insulators are disposed along the full extension of the side edges of said flange.

6. A capsule according to claim 4, wherein the electrical insulators include electrically conductive vias that extend from the upper side to the under side of the electrical insulators.

7. A capsule according to claim 6, wherein a side edge of the electrical insulators to be connected to the flange has a geometrical shape that is able to correspond with the shape and size of a side edge of the flange so as to enable an upper side and an under side of the flange and of the electrical insulator respectively to be brought readily into mutually the same plane.

8. A capsule according to claim 1, wherein said geometric shape is an essentially rectangular shape.

9. A capsule for at least one high power transistor chip for high frequencies, comprising:
    an electrically and thermally conductive flange with an upper side, an underside, and side edges;
    at least two electrical insulators each having an upper side, an underside and a side edge and a geometric shape, the side edge of the electrical insulators is connected to the flange and corresponds with the shape and size of the respective side edge of the flange, so as to enable the upper sides and the under sides of the flange and of the electrical insulator, respectively, to be brought readily into mutually the same plane;
    at least two first electrical connections; and
    a cover member;
    wherein the high power transistor chip is arranged on the flange,
    wherein the electrical insulators are separated from the high power transistor chip and in that second electrical connections are connected to the high power transistor chip and the first electrical connections,
    wherein the at least two first electrical connections are formed by metallizing the electrical insulators from the upper side, around the side edge and down to the underside, and wherein the electrical insulators include electrically conductive vias extending from the upper side to the underside of the electrical insulators.

10. The capsule of claim 9, wherein the flange is made of copper.

11. The capsule of claim 9, wherein the metallization of the electrical insulators does not contact the flange.

12. A capsule for at least one high power transistor chip for high frequencies, comprising:

an electrically and thermally conductive flange with an upper side, an underside, and side edges, the side edges having an upper portion and a lower portion;

at least two electrical insulators each having an upper side, an underside and a side edge, the side edge of the electrical insulators having an upper portion and a lower portion, wherein the upper portion of the side edge of the flange overlaps the lower portion of the electrical insulators;

at least two first electrical connections; and a cover member;

wherein the high power transistor chip is arranged on the flange, wherein the electrical insulators are separated from the high power transistor chip and in that second electrical connections are connected to the high power transistor chip and the first electrical connections, wherein the at least two first electrical connections are formed by metallizing the electrical insulators from an upper side, around the side edge and down to an under side.

13. The capsule of claim 12, wherein the flange is made of copper.

14. The capsule of claim 12, wherein the metallization of the electrical insulators does not contact the flange.

* * * * *